(12) United States Patent
Murmann et al.

(10) Patent No.: US 7,791,410 B2
(45) Date of Patent: Sep. 7, 2010

(54) METHOD AND SYSTEM FOR FET-BASED AMPLIFIER CIRCUITS

(75) Inventors: Boris Murmann, Palo Alto, CA (US); Jason C. Hu, Cupertino, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/260,925

(22) Filed: Oct. 29, 2008

(65) Prior Publication Data

US 2009/0051436 A1 Feb. 26, 2009

Related U.S. Application Data

(63) Continuation of application No. 11/700,372, filed on Jan. 31, 2007, now Pat. No. 7,482,864.

(51) Int. Cl.
*H03F 1/02* (2006.01)
(52) U.S. Cl. .......................................................... 330/9
(58) Field of Classification Search .................... 330/9; 327/124
See application file for complete search history.

(56) References Cited

U.S. PATENT DOCUMENTS 6,965,265 B2 * 11/2005 Chang et al. .................... 330/9
2005/0258997 A1 * 11/2005 Kim et al. ..................... 341/155

* cited by examiner

*Primary Examiner*—Steven J Mottola
(74) *Attorney, Agent, or Firm*—Crawford Maunu PLLC

(57) ABSTRACT

Amplifier circuits and methods are implemented using a variety of different embodiments. According to one such embodiment, a method is implemented using a field-effect transistor (FET) having a gate node, a source node and a drain node. A first circuit state is implemented in which the gate node, the source node and the drain node are connected to inputs that generate a stored charge at the gate node, the amount of stored charge at the gate node being responsive to a first voltage level. A second circuit state is implemented in which the drain node is connected to a voltage source, the source node is connected to a load, and while charge at the gate node is preserved, current between the drain node to the source node drives a voltage level of the load to a proportionally amplified version of the first voltage level.

20 Claims, 7 Drawing Sheets

METHOD AND SYSTEM FOR FET-BASED AMPLIFIER CIRCUITS

RELATED PATENT DOCUMENTS

This patent document is a continuation of U.S. patent application Ser. No. 11/700,372 filed on Jan. 31, 2007 (U.S. Pat. No. 7,482,864) to which priority is claimed under 35 U.S.C. §120.

FIELD OF THE INVENTION

The present invention relates generally to amplifier devices and methods, and more particularly to efficient field-effect-transistor amplifiers and their implementations.

BACKGROUND

Amplifier circuits are used in a variety of devices and applications. Advances in technology have led to a demand for increased functionality, decreased costs and higher efficiency. There have been a number of efforts to develop amplifier circuits to meet these and other demands. In the field of communications systems, for example, there have been extensive efforts to increase the data throughput of the systems. These efforts have often resulted in increased power consumption/dissipation due to factors such as increased chip density, higher signal speeds and precise signaling protocols. Moreover, the communications and other fields have also exhibited significant growth in portable devices. Demand for smaller and more powerful portable devices is often limited by power constraints, such as battery life and power dissipation. Accordingly, a need exists for an amplifier circuit that exhibits high power efficiency, low complexity and high accuracy.

Signal processing circuits used in communications and other systems often require the use of several amplifier circuits. For instance, many signal processing circuits are implemented using one or more analog-to-digital converters (ADC). Amplifier circuits are a major component of many ADCs, both in terms of the functionality and power consumption. For instance, the amplifier circuit often dominates the power consumption of a pipelined ADC because the ADC has an amplifier circuit for each stage of the pipeline. Generally, as the frequency and accuracy of an ADC increases, the power consumption of the amplifier circuits increases. Significant efforts have been made to reduce the power consumption of ADCs, including the amplifier circuits, but there is significant room for improvement.

Amplifier circuits are often constructed using one or more semiconductor devices arranged to amplify an input signal. Often these gates are field-effect-transistors (FET), such as metal-oxide-semiconductor (MOS) field-effect transistors. Typical amplifier circuits receive an input signal and produce an amplification of the input signal by driving an output load. For many FET amplifier circuits, a significant portion of power dissipated by the circuit is not used to drive the load. For instance, a differential-pair amplifier circuit steers a current between two paths, each having a FET. As the output nears the desired voltage, the circuit primarily dissipates the current primarily through the transistors rather than applying the current to the load. This results in a less than trivial amount of power being wasted. Moreover, even where the load is small or nonexistent, significant power dissipation exists.

These and other issues have presented challenges to the implementation and design of amplifier circuits, including those involving switched-capacitor circuits and similar applications. Accordingly, there is a need for an amplifier circuit that provides sufficient accuracy and efficient power consumption.

SUMMARY

The claimed invention is directed to amplifier circuits and methods for efficient FET-based amplifier circuits. The present invention is exemplified in a number of implementations and applications, some of which are summarized below.

Various example embodiments of the present invention are directed to an amplifier circuit for amplifying a first signal to drive an output load. The circuit has a field-effect transistor (FET) with a gate, a source and a drain. A switch arrangement is coupled to the gate, the source and the drain. State control logic provides state information for a first state and a second state. In the first state, the first switch arrangement connects the first signal to the gate and connects the drain and source to reference voltages. In the second state, the switch arrangement disconnects the first signal from the gate, connects the drain to a second reference voltage and connects the source to the output load, thereby causing the FET to operate in source-follower mode.

Another example embodiment of the present invention is directed to a method for use in an amplifier circuit. The method is used for amplifying a first signal using a field-effect transistor (FET) having a threshold voltage. The method places the FET in inversion mode by charging a gate of the FET a voltage responsive to the first signal and driving a source and a drain of the FET to a reference voltage. The method then places the FET in source-follower mode by disconnecting the gate from the first signal, connecting the drain to a voltage supply and connecting the source to an output load. The FET drives the output load to a voltage that is a function of the first signal, a capacitance from gate to source and a capacitance from gate to drain.

Another example embodiment of the present invention is directed to an amplifier circuit for amplifying a first signal to drive an output load. The circuit has a field-effect transistor (FET) having a gate, a drain and a source. A first switch arrangement couples the gate to the input signal. A second switch arrangement couples the source to the output load. A third switch arrangement couples the drain and source to a first voltage. A fourth switch arrangement couples the drain to a second voltage.

Another example embodiment of the present invention is directed to a method, in an amplifier circuit, for amplifying a first voltage using a field-effect transistor (FET) having a threshold voltage and a second voltage on a gate. The method changes the second voltage to the first voltage by changing charge stored on the gate. The method changes the second voltage on the gate by changing the gate to source voltage while conserving charge on the gate. The method uses current through a drain and a source of the FET to drive a load to a third voltage that is amplified relative to the first voltage.

Another example embodiment of the present invention is directed to a method implemented using a field-effect transistor (FET) having a gate node, a source node and a drain node. A first circuit state is implemented in which the gate node, the source node and the drain node are connected to inputs that generate a stored charge at the gate node, the amount of stored charge at the gate node being responsive to a first voltage level. A second circuit state is implemented in which the drain node is connected to a voltage source, the source node is connected to a load, and while charge at the gate node is preserved, current between the drain node to the source node drives a voltage level of the load to a proportionally amplified version of the first voltage level.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different types of devices and processes, and the invention has been found to be particularly suited for the implementation of efficient amplifier circuits and methods. While the present invention is not necessarily limited to such applications, various aspects of the invention may be appreciated through a discussion of examples using this context.

Consistent with an example embodiment of the present invention, a FET-based amplifier circuit is implemented. The amplifier circuit operates by storing a charge on the gate of a FET. The amount of stored charge is determined relative to the voltage of the input signal. The gate is isolated from the charge source to preserve the amount of stored charge. A reference voltage is applied to the drain of the FET. The source of the FET is tied to a load causing the FET to drive the output load until the load reaches a voltage sufficient to disable the flow of current between drain to source. Distribution of charge between a first capacitive element and a second capacitive element results in amplified voltage at the output load. This is particularly useful for amplifying a signal at the gate of a FET to drive an output load using current sourced through the same FET. Moreover, because little to no bias current is required, the majority of the power dissipated by the circuit is used to drive the load.

Consistent with another example embodiment of the present invention, a FET-based amplifier circuit is designed to function as an amplifier. The FET-based amplifier circuit changes the connections to a FET in response to data from state logic. During a first (sample) state, the amplifier circuit charges the FET gate to the input voltage. The source and drain of the FET are driven to reference voltage(s). The difference between the input voltage and the reference voltage(s) (and the capacitance of the FET gate) determines the amount of charge stored on the FET gate. In the second (amplify) state, the gate is isolated such that any stored charge is conserved. In the case of an n-channel FET, the drain is connected to a supply and the source is connected to the load causing the FET to operate as a source follower. In the case of a p-channel FET, the source is connected to the load and the drain is connected to a suitable low supply voltage (e.g., ground). The charge at the gate of the FET causes the voltage at the load to be driven toward the supply voltage. This results in the voltage from gate to load approaching the threshold voltage of the FET. This change in voltage results in the charge stored being redistributed, due to charge conservation. The voltage at the gate of the FET changes in response to the charge distribution, and the FET continues to drive the output load until the voltage from gate to output load reaches the threshold voltage of the FET.

In a more specific embodiment, the amplifier circuit is capable of producing an amplified signal that can drive a load, limited primarily by the current capabilities of the FET. Moreover, the circuit is capable of functioning with only one FET functioning in the analog realm. This is particularly useful for a number of reasons, including the simplicity of the design, the minimization of the die space required for the amplifier and minimizing issues with precise control of analog characteristics of FETS (e.g., FET mismatches).

Consistent with another example embodiment of the present invention, a capacitive element is added at the gate of the FET. This capacitive element is charged during the first state. During the second state, charge is distributed between the gate and the capacitive element. This can be particularly useful for controlling the gain of the amplifier without changing the gate-capacitance characteristics of the FET.

Consistent with another example embodiment of the present invention, the capacitive element can be referenced to a first voltage during the first stage. Subsequently, the reference voltage can be changed, resulting in a net change of the voltage at the gate. This can be particularly useful for compensations to the input signal, such as those sometimes required in multiple stage amplifiers and other circuits.

Figure 1:
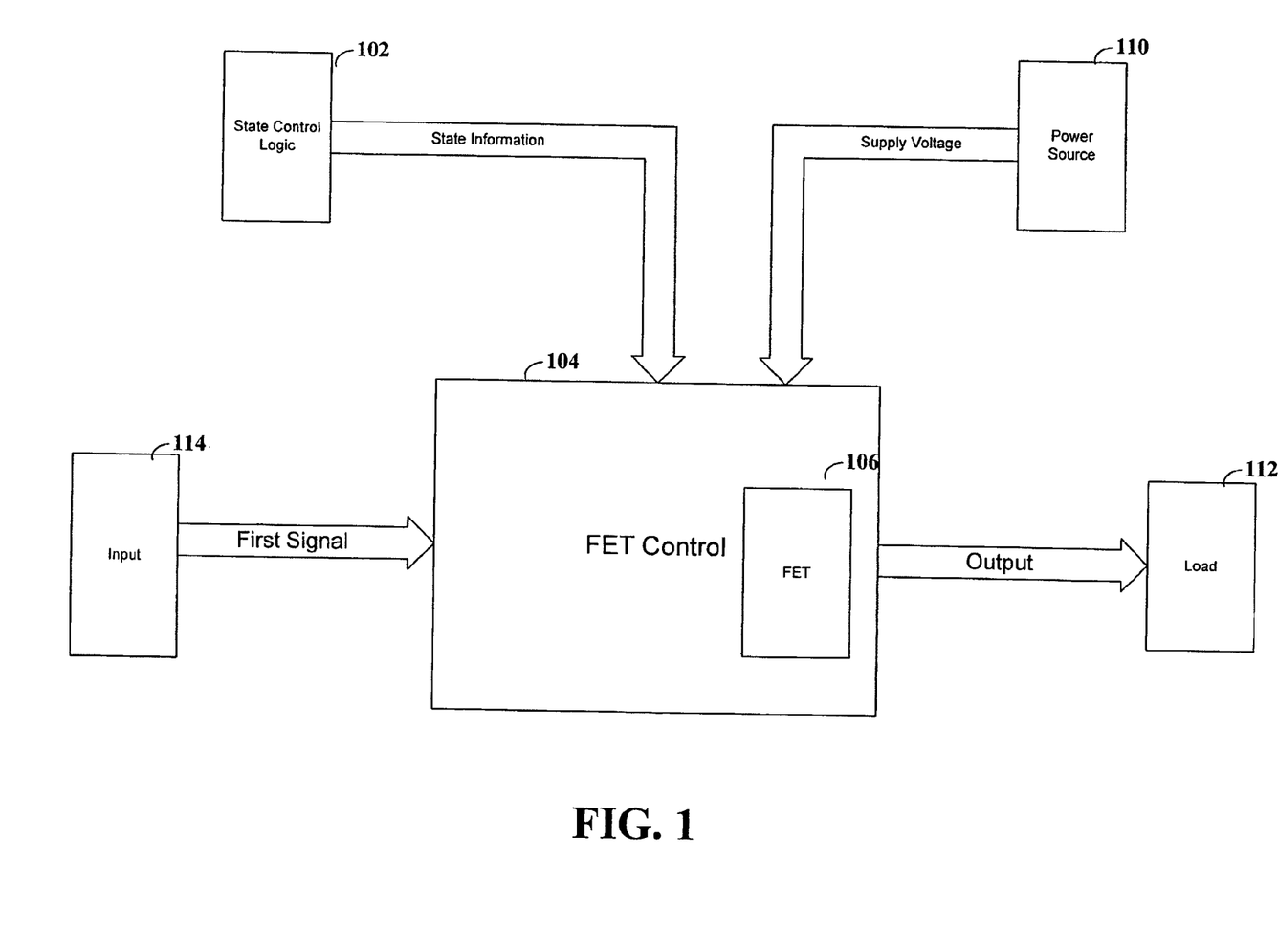
FIG. 1 shows a block diagram of a FET-based amplifier, according to an example embodiment of the present invention.

Turning now to the figures, FIG. 1 shows a block diagram of a FET-based amplifier, according to an example embodiment of the present invention. FET control 104 receives a first signal from input 114, state information from state control logic 102 and a supply voltage from power source 110. FET control 104 controls the operational modes of FET 106. In a particular instance, state control logic provides a set of input signals or clocks that are used to enable/disable one or more switches of FET control 104. Alternate methods are also possible including, but not limited to, using a set of data bits to represent the various states and a decoder to determine the appropriate action.

In a first state, FET control 104 charges the gate of FET 106 to a voltage corresponding to the first signal. In one instance, this is accomplished using a switch (e.g., using a FET) to couple the input 114 to the gate of FET 106. FET control 104 operates such that FET 106 will enter inversion mode (e.g., a conductive path from drain to source). To reduce current flow through FET 106, the drain and source can be tied to a common voltage; however the drain and source need not be tied to identical reference voltages. In the case of an NMOS device, this voltage would be lower than both the first signal and the supply voltage from power source 110. In another instance, FET 106 need not enter inversion mode, but instead the source and drain are tied to suitable reference voltage(s) (e.g., reference voltages that determines the gate-to-drain and gate-to-source voltages created by charging the gate to the first signal).

Figure 6:
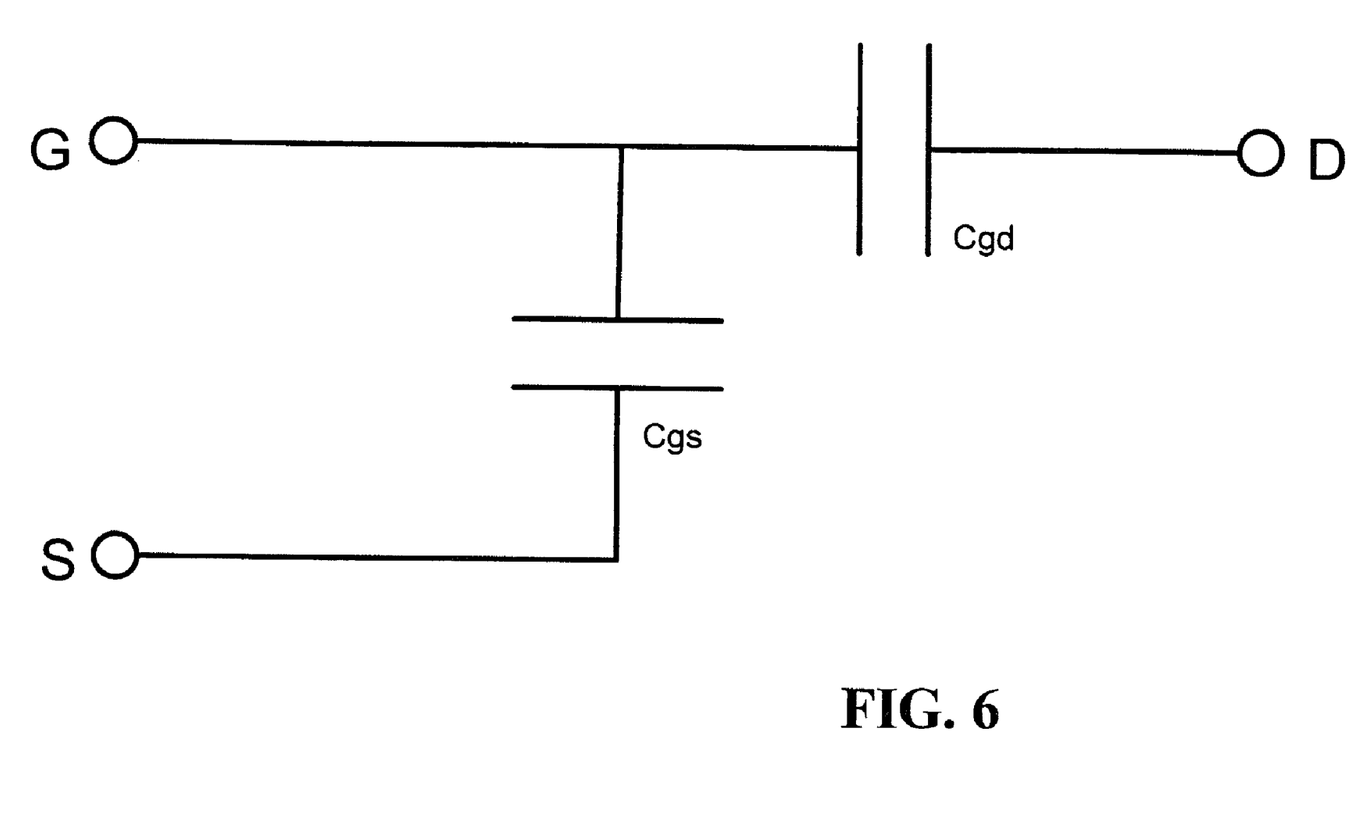
FIG. 6 shows a circuit for simple modeling of the gate capacitance seen on a FET, according to an example embodiment of the present invention.

In a second state, FET control 104 isolates the gate of FET 106 from input 114. FET control 104 also connects the drain to the supply voltage from power source 110 and the source to the load 112. This causes FET 106, functioning as a source follower, to drive load 112 toward the supply voltage. The voltage from gate to source is driven towards to the threshold voltage of the FET. Through conservation of charge, the change in gate voltage from gate to source results in charge distribution. The effective capacitance of the gate to source and gate to drain of FET 106 can be approximated using the circuit shown in FIG. 6. As the voltage from gate (G) to source (S) is changed, the amount of charge stored on capacitor CGS is changed. Through conservation of charge, the charge is distributed to capacitor CGD (connected to gate (G) and drain (D)). FET 106 continues to drive load 112 until the voltage drop from source/body to gate reaches the threshold voltage of FET 106. This process can be repeated as necessary to provide discrete amplification of input signals.

Figure 7:
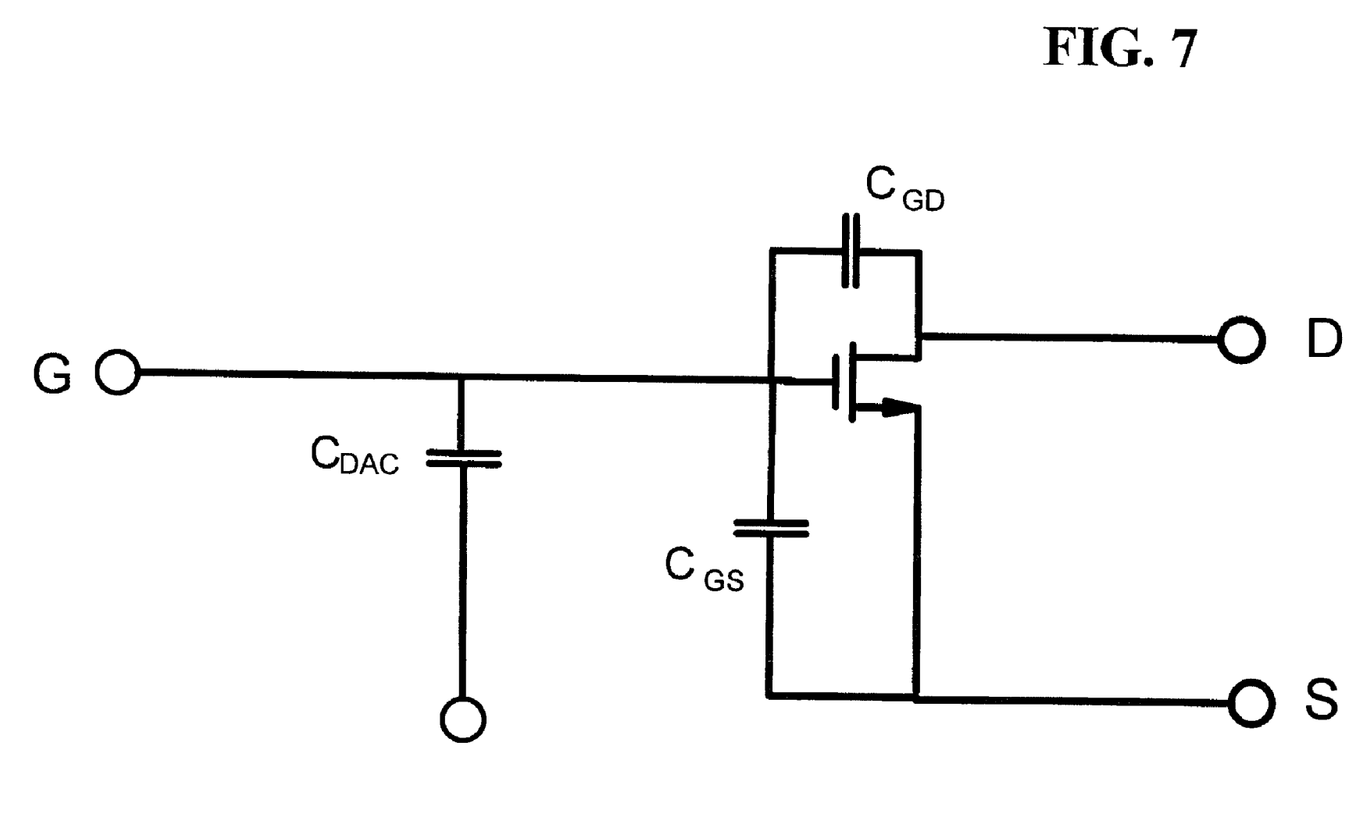
FIG. 7 shows a circuit showing optional capacitive elements, according to an example embodiment of the present invention.

In one embodiment of the present invention, additional capacitive elements can be charged in connection with the gate of FET 106. During the second state, charge is distributed between the additional capacitive elements. FIG. 7 shows an example of several of such additional capacitive elements, including $C_{DAC}$, $C_{GS}$ and $C_{GD}$. These capacitive elements, alone or in any combination thereof, can be implemented as desired. This is particularly useful for controlling the gain of amplifier circuit because it is often easier to more precisely control their capacitance (relative to FET capacitance) due to manufacturing processes.

Figure 2:
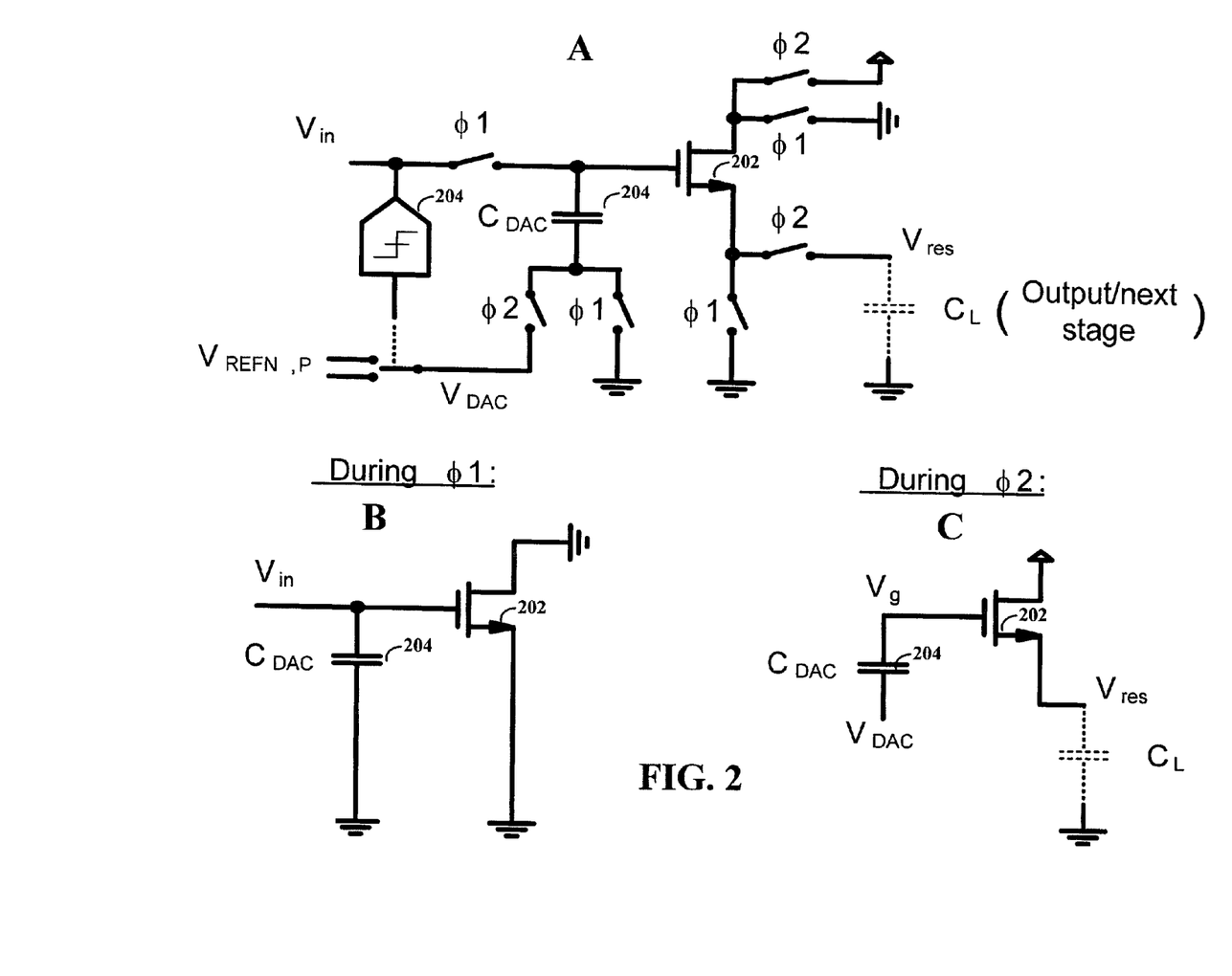
FIG. 2 shows a circuit diagram for an amplifier circuit, according to an example embodiment of the present invention.

FIG. 2 shows a circuit diagram for an amplifier circuit, according to an example embodiment of the present invention. Circuit A includes a set of switches controlled by signals Φ1 and Φ2. These signals correspond to states 1 and 2 respectively, where during state 1 switches denoted by Φ1 are active and switches denoted by Φ2 are inactive. Similarly, during state 2 switches denoted by Φ2 are active and switches denoted by Φ1 are inactive. The representative circuits for states 1 and 2 are shown by circuits B and C, respectively.

During state 1 (circuit B), the gate of FET 202 and the $C_{DAC}$ capacitor are charged to $V_{in}$. If the circuit is part of an ADC stage, the $V_{in}$ signal is converted to a digital signal, as shown by ADC block 204. The $C_{DAC}$ is referenced to ground as are the source and drain of FET 202. In this instance, the gate operates in inversion mode. Moreover, since the drain and source are tied to a common voltage, there is little to no current dissipated from drain to source. The drain and source, however, need not be referenced to ground and the gate need not be in inversion mode for the amplifier circuit to function.

During state 2 (circuit C), the gate and $C_{DAC}$ capacitor are disconnected from $V_{in}$, preserving the charge stored on each. In a staged amplifier implementation, $V_{refN,P}$ can be applied to the $C_{DAC}$ capacitor in order to compensate for the ADC conversion of the previous stage. For instance, in a pipelined ADC, the previous digital value is converted back to analog and subtracted from the input signal to the next amplifier stage. The drain is also connected to a supply voltage and the source to a load $C_L$ to produce output voltage $V_{RES}$. In an alternative implementation, different supply voltages can be selected and applied to the drain of the FET to compensate for previous stages, much like the reference voltages applied to the $C_{DAC}$ capacitor.

Thus, in the first state the circuit acquires its input signal. Hence, the total charge at the gate node of the MOS device is $$Q_1 = V_{in}(C_{DAC} + C_g) + Q_{offset}, \quad (1)$$

where $C_g$ is the gate capacitance of the MOS transistor and Qoffset is a constant dependent on the operational mode (inversion or not inversion) of the MOS transistor during the first state. In the second state, the MOS gate is isolated from the input and a DAC voltage that depends on the decision of the stage's comparator is applied to the bottom plate of $C_{DAC}$. The MOS device is in inversion and begins to act as a source follower, with a gate-to-source voltage roughly equal to its threshold voltage ($V_t$) near the end of the settling transient. Hence, the charge at the gate node at the end of the second phase is approximately given by $$Q_2 = V_t C_g + (V_g - V_{DAC})C_{DAC}. \quad (2)$$

After combining (1) and (2) via charge conservation ($Q_1 = Q_2$), it follows that the stage output voltage is approximately given by $$V_{res} \cong V_g - V_t \cong (V_{in} - V_t)\left(1 + \frac{C_g}{C_{DAC}}\right) + V_{DAC} + \frac{Q_{offset}}{C_{DAC}} \quad (3)$$

Consequently, this circuit is particularly useful for amplifying the input and for providing superposition of a DAC voltage.

Figure 3:
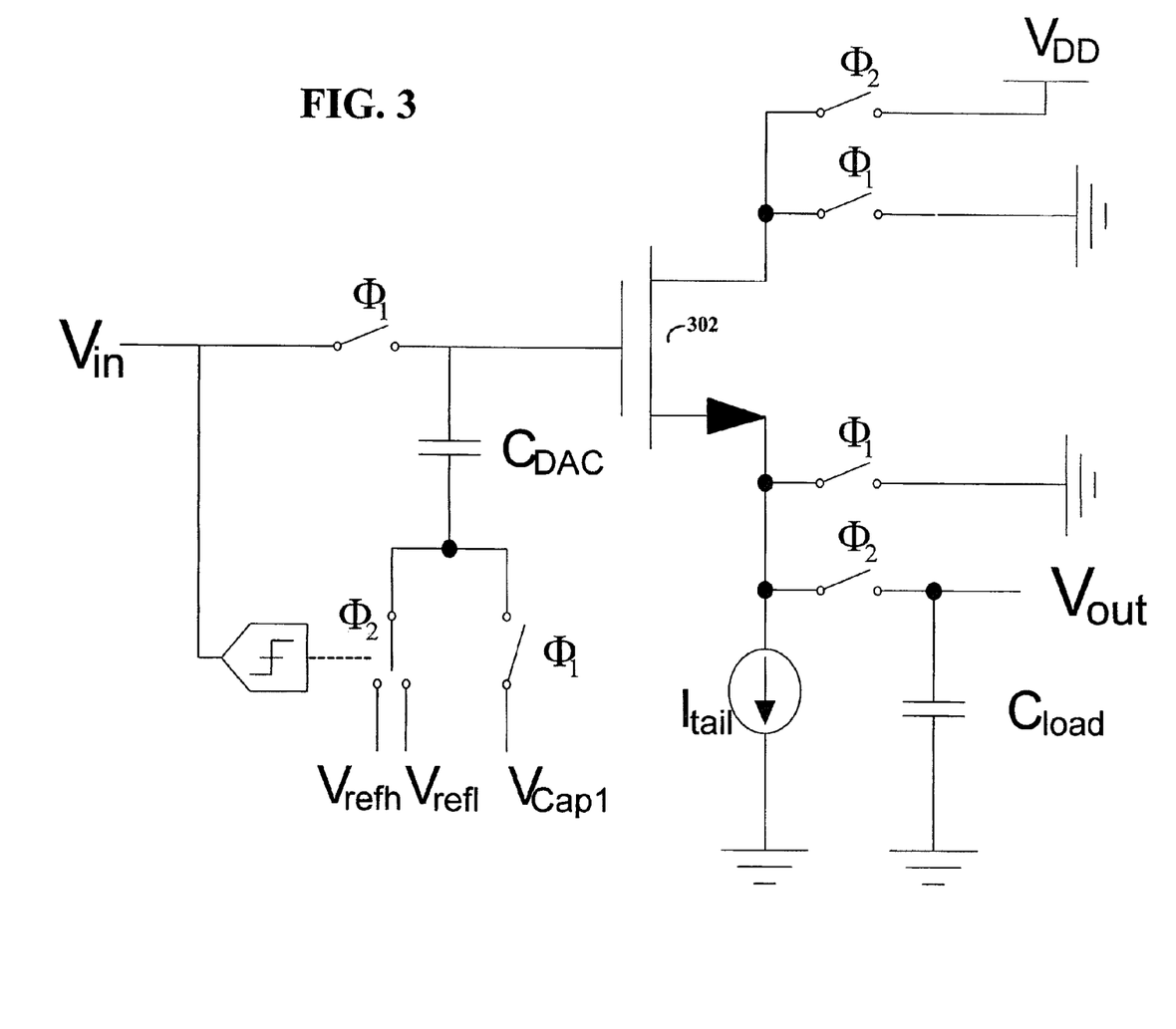
FIG. 3 shows a circuit diagram for an amplifier circuit, according to an example embodiment of the present invention.

FIG. 3 shows a circuit diagram for an amplifier circuit, according to an example embodiment of the present invention. FIG. 3 includes a current source $I_{tail}$ which is connected to the source of FET 302. As FET 302 nears the weak inversion mode (e.g., the gate to source voltage approaches the threshold voltage), the current provided to the load is reduced dramatically. This leads to a slow settling time for the circuit. The addition of a relative weak current source, $I_{tail}$, helps keep the FET operating within the inversion state to increase the current through the FET at or near the final settlement value. Accordingly, the settling time can be improved. In most other respects, the functionality of the circuit of FIG. 3 is similar to that of FIG. 2.

Figure 4:
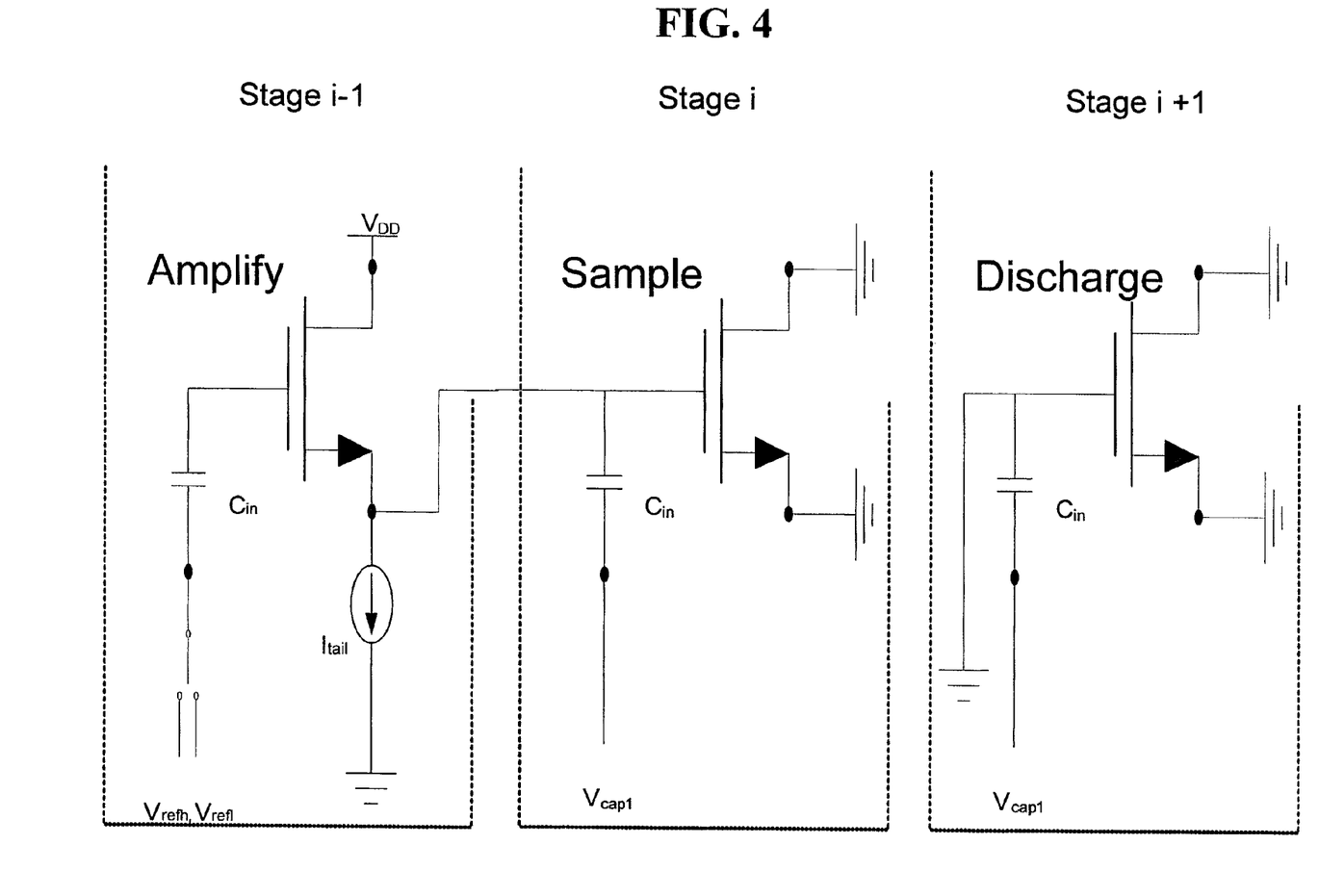
FIG. 4 shows various stages of an amplifier circuit, according to an example embodiment of the present invention.

FIG. 4 shows various stages of an amplifier circuit, according to an example embodiment of the present invention. More specifically, FIG. 4 shows stages of a cascaded amplifier circuit, such as those used by a pipelined ADC. Stage i shows a sample stage, stage i–1 shows an amplify stage and stage i+1 shows a discharge stage. In stage i the input signal to be amplified is stored on $C_{in}$ and the gate of the FET. If stage i is the first stage, then the input signal could be from an external source. Otherwise, the input signal is received from a previous amplification stage (e.g., stage i–1).

In the amplify stage i–1, the input voltage from the sample stage is amplified for storage on the load connected to the source of the FET (e.g., the input of the next stage). The input voltage can be modified (by selecting $V_{refn}$ or $V_{refl}$) to compensate for the DAC value from the previous stage as shown by the $V_{capl}$ reference voltage. Current source $I_{tail}$ can be implemented to facilitate settling of the output voltage.

Figure 5:
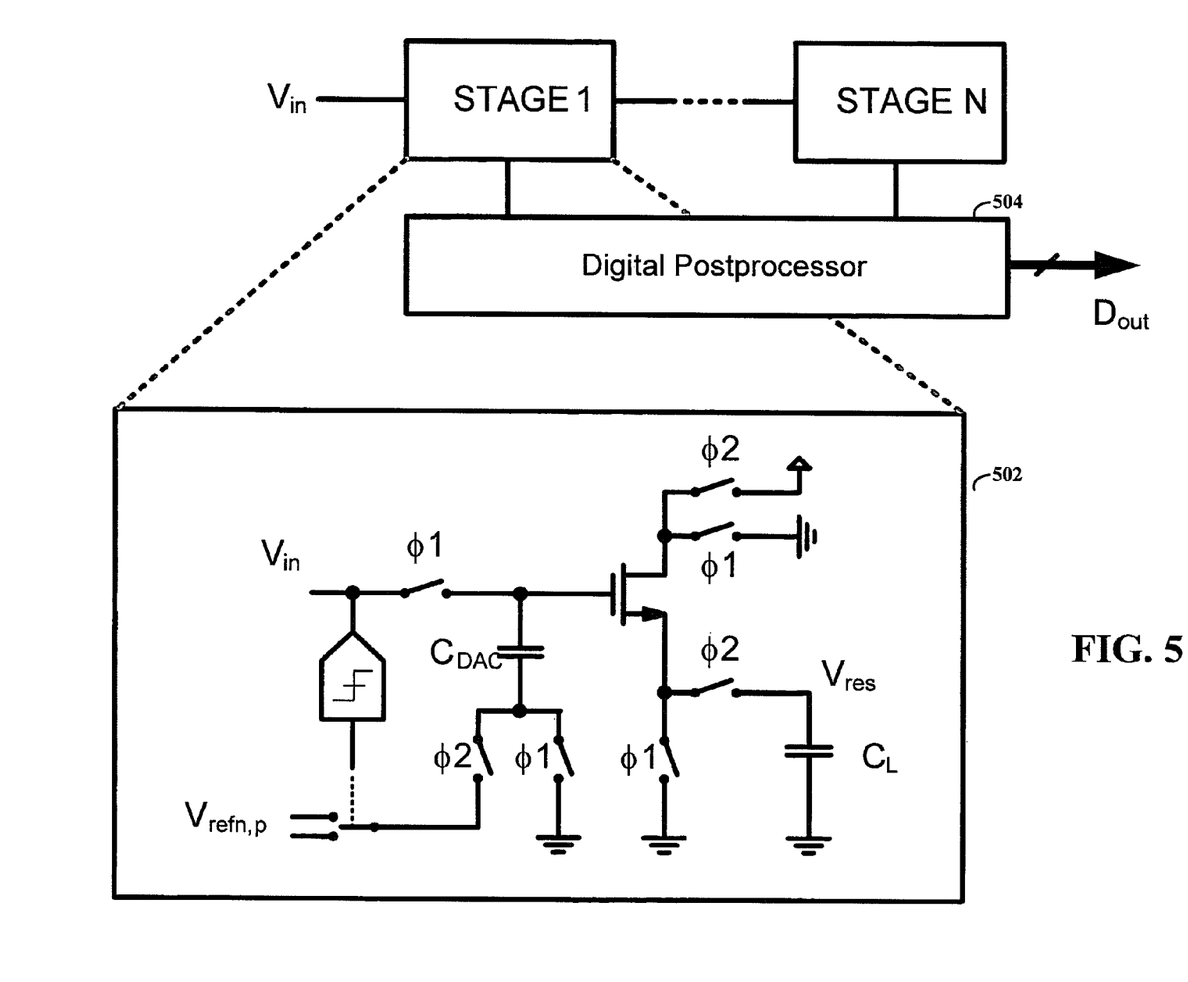
FIG. 5 shows a block diagram of a pipelined ADC, according to an example embodiment of the present invention.

In the discharge stage i+1, charge stored on the FET is removed in preparation for the next stage (sample). FIG. 5 shows a block diagram of a pipelined ADC, according to an example embodiment of the present invention. Stages 1 to N each represent an amplifier stage 502. At each stage the input signal is converted back to a digital value by digital post processor 504. The digital value is converted to an analog value and compensated for using $V_{refn,p}$. Digital postprocessor can correct for inaccuracies and nonlinearities in the amplifier stages. For further details on such postprocessor correction techniques reference can be made to "A 12-bit 75-MS/s Pipelined ADC Using Open-Loop Residue Amplification" by Murmann et al, IEEE Journal of Solid-State Circuits, Vol. 38, No. 12, December 2003, which is fully incorporated herein by reference.

One skilled in the art would recognize that the FET could be implemented using a variety of different FET devices including, but not limited to, depletion, enhancement, PMOSFET, NMOSFET, JFET, IGFET and MESFET. For simplicity, the descriptions and figures discussed herein are primarily directed to NMOSFET devices. Unless otherwise stated, it is understood that the descriptions and circuits discussed herein could be modified to function using a variety of different FET devices (e.g., a PMOSFET could be used in place of an NMOSFET by, for instance, varying the voltage levels at the source and drain). Moreover, unless otherwise stated, the FET device used by the various embodiments is assumed to be configured with the body connected to the source. One skilled in the art would also recognize that other modifications to various embodiments could be implemented. For instance, the body could be controlled by a set of switches that alternate between the output load and another voltage. Changes in the voltage would allow flexibility in the initial gate capacitance, thereby allowing for modifications to the gain of the device.

While the present invention has been described with reference to several particular example embodiments, those skilled in the art will recognize that many changes may be made thereto without departing from the spirit and scope of the present invention. Such changes may include, for example, various circuits other than ADCs can be used as well as a number of different FETs. These and other approaches as described in the claims below characterize aspects of the present invention.

What is claimed is:

1. A method using a field-effect transistor (FET) having a gate node, a source node and a drain node, the method comprising:
   implementing a first circuit state in which the gate node, the source node and the drain node are connected to inputs that generate a stored charge at the gate node, the amount of stored charge at the gate node being responsive to an input voltage level; and
   implementing a second circuit state in which
      the drain node is connected to a voltage source,
      the source node is connected to a load, and
      while the charge stored at the gate node during the first circuit state is preserved, current between the drain node to the source node drives a voltage level of the load to a proportionally amplified version of the input voltage level.

2. The method of claim 1, wherein preserving the charge stored at the gate node includes maintaining the charge at the gate node by isolating the gate node from all voltage and current sources.

3. A method using a field-effect transistor (FET) having a gate node, a source node and a drain node, the method comprising:
   implementing a first circuit state in which the gate node, the source node and the drain node are connected to inputs that generate a stored charge at the gate node, the amount of stored charge at the gate node being responsive to an input voltage level;
   implementing a second circuit state in which
      the drain node is connected to a voltage source,
      the source node is connected to a load, and
      while the charge stored at the gate node during the first circuit state is preserved, current between the drain node to the source node drives a voltage level of the load to a proportionally amplified version of the input voltage level;
   changing a gate-to-source voltage level of the FET to cause a change in a gate-to-drain voltage of the FET through charge distribution of the charge stored at the gate node.

4. The method of claim 3, further including the step of disabling the FET in response to the gate-to-source voltage level reaching a voltage threshold of the FET.

5. The method of claim 1, wherein driving a voltage level of the load to a proportionally amplified version includes creating a FET-conduction channel between the gate node and the source node.

6. A method using a field-effect transistor (FET) having a gate node, a source node and a drain node, the method comprising:
   implementing a first circuit state in which the gate node, the source node and the drain node are connected to inputs that generate a stored charge at the gate node, the amount of stored charge at the gate node being responsive to an input voltage level; and
   implementing a second circuit state in which
      the drain node is connected to a voltage source,
      the source node is connected to a load, and
      while the charge stored at the gate node during the first circuit state is preserved, current between the drain node to the source node drives a voltage level of the load to a proportionally amplified version of the input voltage level;
   wherein, in the first circuit state, the gate node is connected to the input voltage level and the source node and the drain node are each connected to a reference voltage level.

7. A method using a field-effect transistor (FET) having a gate node, a source node and a drain node, the method comprising:
   implementing a first circuit state in which the gate node, the source node and the drain node are connected to inputs that generate a stored charge at the gate node, the amount of stored charge at the gate node being responsive to an input voltage level; and
   implementing a second circuit state in which
      the drain node is connected to a voltage source,
      the source node is connected to a load, and
      while the charge stored at the gate node during the first circuit state is preserved, current between the drain node to the source node drives a voltage level of the load to a proportionally amplified version of the input voltage level;
   wherein, in the first circuit state, the gate node is connected to a reference voltage level and the source node and the drain node are each connected to the input voltage level.

8. A method using a field-effect transistor (FET) having a gate node, a source node and a drain node, the method comprising:
   implementing a first circuit state in which the gate node, the source node and the drain node are connected to inputs that generate a stored charge at the gate node, the amount of stored charge at the gate node being responsive to an input voltage level; and implementing a second circuit state in which
the drain node is connected to a voltage source,
the source node is connected to a load, and
while the charge stored at the gate node during the first circuit state is preserved, current between the drain node to the source node drives a voltage level of the load to a proportionally amplified version of the input voltage level;

wherein, in the first circuit state, the gate node is connected to a first voltage level, and the source node and the drain node are each connected to a second voltage level and wherein the difference between the first and second voltage levels is responsive to the input voltage level.

9. The method of claim 1, wherein, in the first circuit state and in the second circuit state, a capacitor, external to the FET, is connected to the gate node on a first side of the capacitor.

10. A method using a field-effect transistor (FET) having a gate node, a source node and a drain node, the method comprising:

implementing a first circuit state in which the gate node, the source node and the drain node are connected to inputs that generate a stored charge at the gate node, the amount of stored charge at the gate node being responsive to an input voltage level; and implementing a second circuit state in which
the drain node is connected to a voltage source,
the source node is connected to a load, and
while the charge stored at the gate node during the first circuit state is preserved, current between the drain node to the source node drives a voltage level of the load to a proportionally amplified version of the input voltage level;

wherein, in the first circuit state, a capacitor is connected to a gate node on a first side of the capacitor and to a reference voltage on a second side of the capacitor and, in the second circuit state, the capacitor is connected to a voltage level derived from a previous amplification stage on the second side of the capacitor.

11. The method of claim 9, wherein a second side of the capacitor is connected to the drain node.

12. The method of claim 9, wherein a second side of the capacitor is connected to the source node.

13. The method of claim 10, wherein a steady state of the second circuit state occurs when the voltage level of the load reaches the proportionally amplified version of the first voltage level.

14. The method of claim 10, wherein, in the second circuit state, a current source is attached to the source node.

15. The method of claim 10, further including the step of implementing post-processing to account for properties of the FET that effect the proportionality of the amplification.

16. A method using a field-effect transistor (FET) having a gate node, a source node and a drain node, the method comprising:

storing a charge at the gate node of the FET, the charge being responsive to a first voltage level; and while preserving the charge stored at the gate node, enabling current, from a voltage source and through a source-drain path of the FET, to drive the source node to a second voltage level that is a proportional amplification of the first voltage level.

17. The method of claim 16, wherein preserving the charge stored at the gate node includes maintaining the charge at the gate node by isolating the gate node from all voltage and current sources.

18. The method of claim 16, wherein the step of storing a charge at the gate node of the FET includes applying a charge voltage across the gate node and at least one of the source node and the drain node, the charge voltage being proportional to the first voltage level.

19. A method using a field-effect transistor (FET) having a gate node, a source node and a drain node, the method comprising:

storing a charge at the gate node of the FET, the charge being responsive to a first voltage level; and while preserving the charge stored at the gate node, enabling current, from a voltage source and through a source-drain path of the FET, to drive the source node to a second voltage level that is a proportional amplification of the first voltage level; and changing a gate-to-source voltage level of the FET to cause a change in a gate-to-drain voltage of the FET through charge distribution of the charge stored at the gate node.

20. The method of claim 16, further including the step of using a capacitor, external to the FET and connected to the gate node, to store at least some of the charge at the gate node.

* * * * *